United States Patent [19]

Chirino et al.

[11] B 3,999,004
[45] Dec. 21, 1976

[54] MULTILAYER CERAMIC SUBSTRATE STRUCTURE

[75] Inventors: Octavio I. Chirino; Joseph Hromek, both of Endwell; Kailash C. Joshi, Endicott; George C. Phillips, Jr., Endwell, all of N.Y.

[73] Assignee: International Business Machines Corporation, Armonk, N.Y.

[22] Filed: Sept. 27, 1974

[21] Appl. No.: 509,772

[44] Published under the second Trial Voluntary Protest Program on March 16, 1976 as document No. B 509,772.

[52] U.S. Cl. .................. 174/68.5; 29/625; 264/61; 264/62; 264/131; 427/96; 427/97
[51] Int. Cl.[2] ............ H05K 1/04; H05K 1/14
[58] Field of Search ............ 29/624, 625, 628; 174/68.5, DIG. 3; 317/101 A, 101 B, 101 CE, 101 CM, 101 D; 117/201, 212, 213, 229, 8.5, 18–23, 31, 38, 54, 66, 101, 105, 105.4, 107.1, 119.6; 118/55, 56, 320, 52; 264/60–62, 131, 132, 134; 427/96, 97

[56] References Cited

UNITED STATES PATENTS

| 3,661,638 | 5/1972 | Lemecha | 117/212 |
| 3,699,919 | 10/1972 | Coffman | 118/56 |
| 3,770,529 | 11/1973 | Anderson | 174/68.5 X |
| 3,852,877 | 12/1974 | Ahn | 27/625 |

Primary Examiner—C.W. Lanham
Assistant Examiner—Joseph A. Walkowski
Attorney, Agent, or Firm—Charles S. Neave

[57] ABSTRACT

This is a microelectronic multilayer circuit structure having circuit compatibility encapsulated within the circuit package including conductive electrical interconnection means formed by uniquely metallizing the "via" and/or blind interconnection holes within the circuit package. The assembly process provides means of uniformly metallizing the interlayer connecting holes.

9 Claims, 9 Drawing Figures

MULTILAYER CERAMIC SUBSTRATE STRUCTURE

BACKGROUND OF THE INVENTION

1. Field of the Invention

This invention relates to the fabrication of a multilayer circuit substrate structure, and more particularly, to the process for uniformly metallizing the interlayer electrical interconnecting paths.

2. Description of the Prior Art

In the production of printed circuits, many methods have been used to provide electrical connections through the circuit boards, substrates, or the like. The actual connectors have included such means as conductive inserts to plated through-holes, often referred to as "vias." The multilayer printed circuit board manufacture and the coating of the walls of the through-holes or "vias" can be accomplished by a number of known processes, as for example, those described in U.S. Pat. Nos. 3,319,317 and 3,739,469 assigned to the same assignee as this application, and as well as U.S. Pat. No. 3,436,819.

In present day technology and with the transition to use of ceramic materials in the manufacture of substrates, patents are issuing which are directed to the manufacture of ceramic bases, the circuitry packaging and the interconnecting circuitry for such packages. For example, U.S. Pat. No. 3,200,298 disclosed integrated and hybrid semiconductor and thin film circuits utilizing multilayer supercooled liquid or ceramic wafer assemblies as a substrate material. U.S. Pat. No. 3,360,852 relates to ceramic bases suitable for mounting electrical circuit elements and to a method for making such bases. U.S. Pat. No. 3,423,517 discloses a microelectronic circuit device having circuitry encapsulated within a sintered monolithic ceramic body formed by metallizing the ceramic prior to firing in a reducing atmosphere. U.S. Pat. No. 3,634,600 discloses a ceramic package bearing an electrically conducting pattern and adapted to receive diminutive electronic components such as semiconductor elements and which includes metallic plugs in the conducting pattern to serve as islands to which the internal lead connections are made.

Formation of electrical connections between two or more planes of circuitry within ceramics has always been an area of interest and the significance intensifies as the need for an increased number of layers are necessary to meet more extensive requirements of present day technology. A method that successfully accomplishes interplanar connections is one in which solid "vias" are made out of past in each green ceramic layer followed by a stacking of layers, lamination, and firing. However, there are applications where solid "vias" are not adequate and a need for hollow type connections becomes imminent.

SUMMARY OF THE INVENTION

The multilayer substrate structuring of the present invention overcomes disadvantages of prior known constructions and includes features and advantages of providing a uniquely new capability of making hollow electrical interconnecting means between two or more metallized planes within a substrate as well as between two or more substrates in the same package.

Briefly, the process of making and metallizing hollow "via" and/or blind electrical interconnections between two or more planes is accomplished by stacking a plurality of green sheet lamina punched or unpunched according to a predetermined pattern, metallizing the "bottom-of-the-hole" green sheet lamina with metal paste according to a predetermined hole pattern, drilling the upper green sheet laminae in accordance with a predetermined hole pattern, stacking the holed green sheet laminae, stacking the uppermost green sheet lamina with its carrier of a material such as polyethylene-terephthalate attached to function as a mask, attaching the laminar stack to a rotatable wheel, filling the hole formations formed by the laminar stacking with a metal paste, and rotating the wheel to remove excess metal paste and to evenly coat the side walls of the "via" and/or blind hole structures by an application of centrifugal force technique, removing the mask lamina and metallizing the uppermost green sheet lamina with the desired circuit pattern followed by a sintering of the laminar assembly.

It is a primary object of the invention to provide an improved electrical interconnecting system for a multilayer packaging assembly.

It is a further object of the invention to provide an improved multilayer circuit board assembly.

It is still another object of the present invention to provide an electronic subassembly comprising a plurality of layers of material and incorporating an improved interlayer electrical connecting system.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
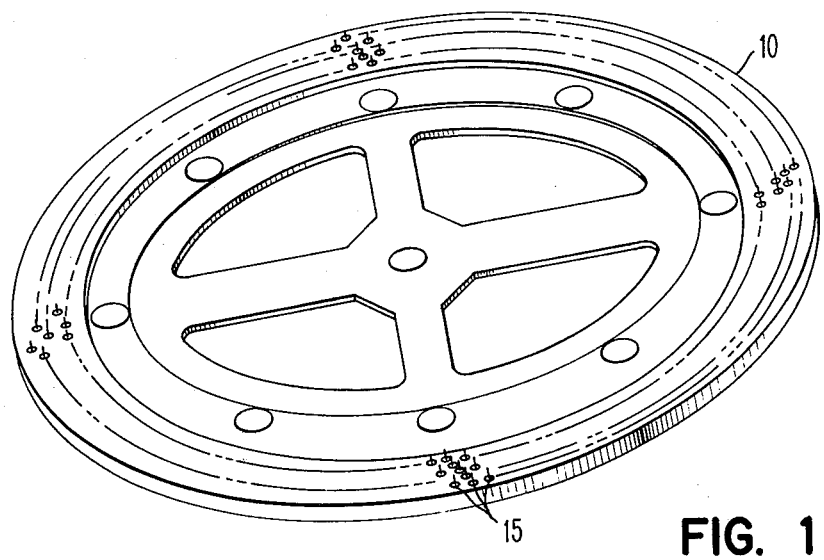
FIG. 1 is an isometric showing of a multilayer ceramic substrate package incorporating metallized holes fabricated in accordance with the instant invention.

Referring to FIG. 1, there is shown a multilayer ceramic substrate package adapted for supporting and interconnecting with a wafer-type silicon circuit device. A plurality of such packages can be mounted in a stacked array and electrically interconnected to provide logic and/or memory functions in data processing systems. The ceramic substrate package and particularly the process for metallizing of blind or throughholes is uniquely accomplished in accordance with the invention.

Figure 2:
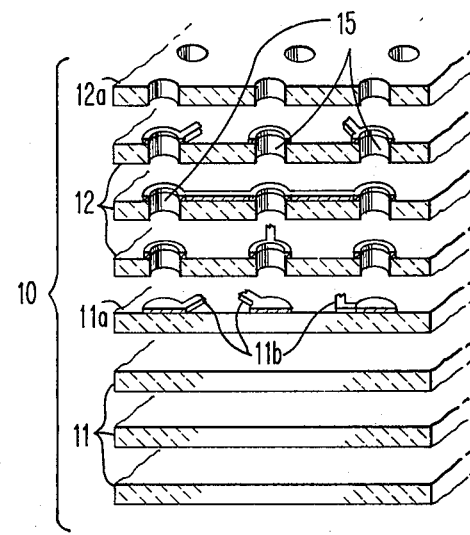
FIG. 2 is an exploded fragmentary view of a ceramic substrate package comprising a stack of punched and drilled green sheet ceramics.

The first embodiment will describe a monolithic multilayer ceramic substrate and wafer carrier structure including blind holes. The structure 10 can be fabricated by first stacking a plurality of unholed green sheet ceramic lamina 11 (FIG. 2) with the binder rich sides facing in an upward direction. The green sheet lamina comprises a polyethylene-terephthalate carrier, more commonly known as MYLAR, (a trademark of E. I. du Pont de Nemours and Company, Inc.) and a layer of alumina ($Al_2O_3$). The uppermost layer 11a of the unholed green sheets 11 forms the bottom of a blind hole structuring for the substrate package being fabricated. The upper surface of the uppermost layer 11a of the unholed stack is metallized 11b, in accordance with a predetermined circuit pattern dependent upon the application use of the substrate package, by coating a liquid or paste comprising a metallic ingredient, a vehicle, a glass frit and a binder, and applying the liquid or paste to the ceramic by a silk screen technique. Next, a plurality of green sheet ceramic lamina 12 are drilled or punched in accordance with the blind hole pattern. The holed lamina sheets 12 are stacked with the binder rich sides up and upon the lower unholed laminar stack 11. The uppermost layer 12a of the holed green sheet lamina 12 is stacked with the MYLAR carrier intact and adapted to function as a mask.

Alternatively, the package could be fabricated by assembly of cast layers of ceramic material or the like.

Figure 3:
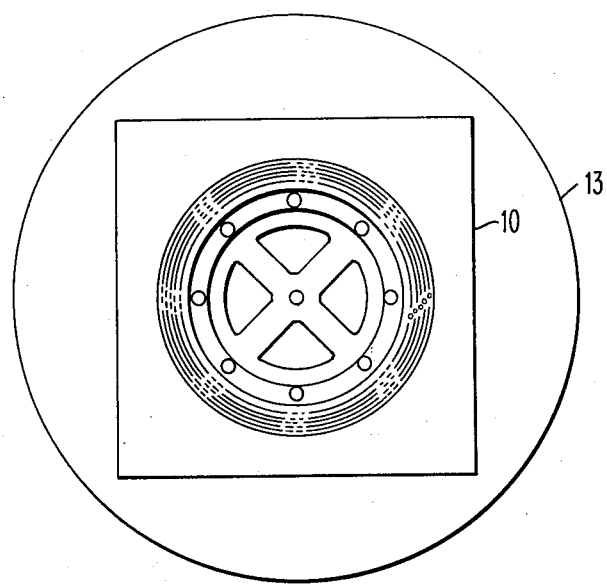
FIG. 3 is a plan view of a ceramic substrate package attached to a rotatable disc in readiness for application of paste and spinning according to the fabrication process of the present invention.
Figure 4:
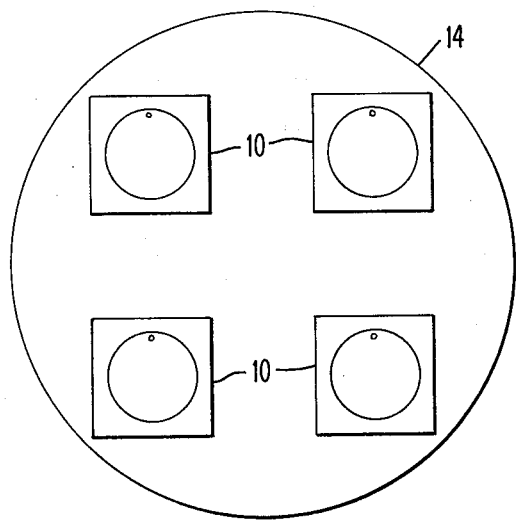
FIG. 4 is a plan view showing of a plurality of green sheet ceramic substrate packages attached to a spinning wheel at a position radially removed from the center of the spinning wheel.

The laminar package 10, as now assembled, is attached to a rotatable wheel 13 (FIG. 3). The laminar stack 10 may be centrally positioned and attached to the rotatable wheel 13. Alternatively, several laminar stacks 10 may be placed on a larger wheel 14 (FIG. 4) at some point radially removed from the center of the wheel. Also, a more elaborately structured and geared wheel (not shown) may be used wherein the laminar stacks 10 are placed on the wheel with similar point orientation and will retain the point orientation throughout a wheel spinning operation.

The blind holes 15 are filled with a diluted metal paste which may be applied by spraying or brushing. The paste composition is basically and preferably about 83% molybdenum powder with average powder size about 2.55 microns, and which melts at from 1800° to about 2000° C. The molybdenum powder is in about a 17% vehicle comprising 70.6% butyl "Carbitol" acetate, 8.2% ethyl cellulose N-7 grade, 10.6% ethyl cellulose N-50 grade, and 10.6% Sarkosyl-O. Initially the viscosity is at 43,000 to 62,000 centipoise. Acceptable dilution is from 10 to 30%, with 21% by weight of BCA (butyl "Carbitol" acetate) solvent preferred. For application of the paste for spraying, a pressure range of from 40 to 70 lbs./sq.in. may be used with 55 lbs/sq.in. preferred. Other compositions of paste may be used with acceptable results and remain within the inventive concept of the present invention.

The wheel 13 with attached laminar stack 10 is then rotated and whereupon the centrifugal forces act to remove excess metal paste and to uniformly and evenly coat the interior side walls of the blind holes 15 in the laminar stack 10. The thickness of the metal paste coating on the interior side walls of the blind holes 15 will be principally dependent upon the viscosity of the metal paste and the speed of rotation of the wheel 13. For example, in accordance with the metal paste composition described above one may use a speed in the range of 800 RPM (revolutions per minute) up to 2000 RPM. Further, it was empirically determined that most satisfactory results of metal paste coating in the blind holes 15 were obtained when the period of time for rotation was in a range of from 5 to 15 seconds.

After the spinning operation, the carrier mask layer is removed. The laminar green sheet package 10 is then metallized, preferably by a silk screen process, to provide the desired circuit patterns. This is then followed by a sintering of the laminar package to drive-off or evaporate the solvent and carrier vehicle and thereby solidify the package structure.

In another embodiment, a monolithic multilayer ceramic substrate and wafer carrying package can be fabricated and provided with "via" or through-holes 16 by drilling a plurality of green sheet lamina in accordance with the predetermined hole pattern. This is followed by a stacking of the holed or punched green sheet lamina with binder rich sides facing in an upward direction. The uppermost green sheet lamina with the MYLAR carrier attached is adapted to function as a mask during paste filling of the holes. The paste compositon as previously described can be applied by spraying, brushing, or vacuuming into the through-holes 16. The MYLAR carrier functions as a mask preventing the paste from getting on other parts of the green ceramic during the hole filling operation. The mask is removed after the hole filling operation is completed. The laminar stack is then attached to a rotatable wheel 13 or 14, and spun for a period of time ranging from 5 to 15 seconds to remove the excess metal paste and evenly coat the inner side walls of the through-holes. The mask layer is now removed from the uppermost green sheet lamina followed by a metallization of the uppermost green sheet lamina with a predetermined circuit pattern. The substrate package is then sintered according to well-known sintering techniques.

Other laminar assemblies can be fabricated combining both the through-holes and blind holes to accommodate interplanar electrical connection patterns.

In a fabrication where it is necessary to metallize the holes of a ceramic substrate package 10 which has been previously fired, the substrate package 10 can be placed on the rotatable wheel 13 or 14, a mask applied, and paste applied to fill the holes 15 and/or 16. The paste used in this embodiment would be selected from switchable compositions of silver-palladium, silver-palladium-gold, gold, or copper, The application of paste is followed by a spinning operation to remove the excess paste. After the mask is removed, a second firing of the assembly would be required. The second firing can be at a lower temperature which would be dependent upon the paste composition used.

Figure 5:
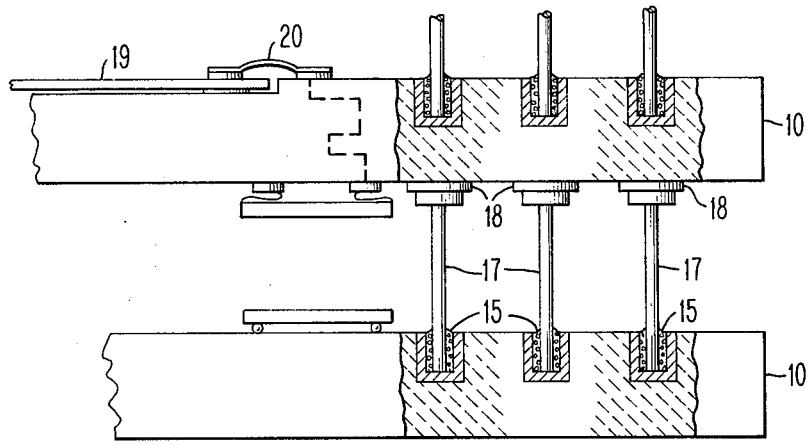
FIG. 5 is a fragmentary cross-sectional view showing the use of blind holes for electrical intersubstrate package connection purposes.

In summary, the techniques of this invention provide improved electrical interconnection capability for green or fired ceramics not heretofore available. FIGS. 5 through 9 show various applications of the blind and through-holes after metallization in accordance with the present invention. For example, FIG. 5 shows the stacking of two ceramic carriers with intersubstrate package 10 connection made by the interconnecting pins 17 attached in the "buried" bucket or blind holes 15 and connected at the upper end of the pins to the surface mounted pads 18. The ceramic substrate package 10 shows a silicon wafer 19 supported by the substrate package and interconnected to metallized circuitry on the substrate package 10 by means of the beam lead 20.

Figure 6:
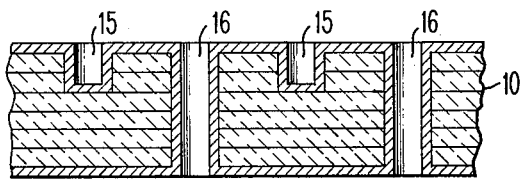
FIG. 6 is a fragmentary cross-sectional view of a multilayer ceramic substrate showing the metallization of both blind and through-holes.
Figure 7:
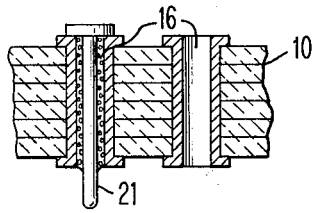
FIG. 7 is a fragmentary cross-sectional view of a multilayer ceramic substrate showing an electrical connecting pin secured to the metallized through-hole.
Figure 8:
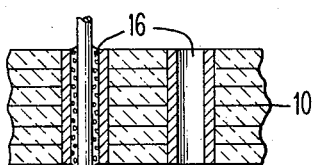
FIG. 8 is a fragmentary cross-sectional view showing the ceramic substrate packages using interpinned through-holes.
Figure 9:
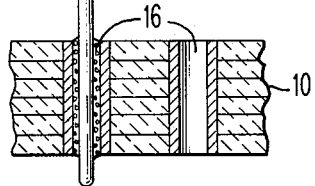
FIG. 9 is a fragmentary cross-sectional view showing metallized blind holes and interplanar electrical connections to a surface mounted electrical connecting pin.
Figure 9:
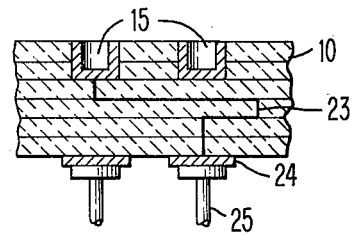

FIG. 6 is a fragmentary cross-sectional view showing metallized blind holes 15 and through-holes 16. FIG. 7 is a fragmentary cross-sectional view showing metallized through-holes 16, one of which has interconnecting pin 21 secured therein. FIG. 8 is a fragmentary cross-sectional view showing two ceramic carrier packages 10 with an interconnecting pin 22 the through-holes 16. FIG. 9 is a fragmentary cross-sectional view of the ceramic substrate package 10 showing interplanar electrical connecting means 23 connecting the metallized blind hole 15 with a surface mounted electrical pad 24 that in turn connects with an electrical interceramic package connecting pin 25.

While the invention has been particularly shown and described with reference to preferred embodiments thereof, it will be understood by those skilled in the art that various changes in form and details may be made therein without departing from the spirit and scope of the invention.

What is claimed is:

1. A monolithic multilayer ceramic substrate electrical interconnection system with interlayer electrical connecting by means of through holes and fabricated by:
   drilling a plurality of green sheet lamina in accordance with a predetermined hole pattern,
   stacking a holed green sheet laminae with binder rich sides up to form a laminar assembly,
   stacking the uppermost green sheet lamina with a polyethylene-terephthalate carrier attached and adapted to function as a mask,
   attaching the laminar stack to a rotatable wheel,
   filling the hole formations formed by the laminar stacking with a metal paste composition including 70 to 90% molybdenum powder,
   rotating the wheel to remove excess metal paste and evenly coat the side walls of the hole formations,
   removing the mask carrier from the uppermost green sheet lamina,
   metallizing the top and bottom surfaces of the green sheet laminar assembly with predetermined circuit patterns, and
   sintering the laminar assembly.

2. A monolithic multilayer ceramic substrate electrical interconnection system with interlayer electrical connecting as fabricated in claim 1, wherein the molybdenum powder includes an average powder size ranging from 1 to 5 microns.

3. A monolithic multilayer ceramic substrate electrical interconnection system with interlayer electrical connecting as fabricated in claim 2, wherein the metal paste is diluted from 10 to 30% by weight with a solvent.

4. A monolithic multilayer ceramic substrate electrical interconnection system with interlayer electrical connecting by means of of blind hole vias and fabricated by:
   first stacking a plurality of unholed green sheet lamina with binder rich sides up,
   metallizing the upper surface of the uppermost unholed green sheet lamina with a metal paste according to a predetermined hole pattern and on the binder rich side to render said uppermost sheet effective as a bottom-of-hole sheet
   drilling a plurality of upper green sheet lamina in accordance with the predetermined hole pattern,
   stacking the holed green sheet laminae each with binder rich sides up and on top of said bottom-of-hole sheet to produce the connecting blind hole vias
   stacking the uppermost holed green lamina with a carrier attached and adapted to function as a mask,
   attaching the laminar stack assembly to a rotatable wheel,
   filling the blind hole formations formed by the laminar stacking with a metal paste composition including 70 to 90% molybdenum powder to provide the interlayer electrical connections to said metallized bottom-of-hole sheet
   rotating the wheel with laminar stack assembly attached in order to remove excess metal paste and evenly coat the inner side walls of the blind holes,
   removing the mask carrier from the uppermost holed green sheet lamina,
   metallizing the uppermost holed green sheet lamina with a predetermined circuit pattern, and
   sintering the laminar assembly.

5. A monolithic multilayer ceramic substrate electrical interconnection system with interlayer electrical connecting as fabricated in claim 4 wherein the molybdenum powder includes an average powder size ranging from 1 to 5 microns.

6. A monolithic multilayer ceramic substrate electrical interconnection system with interlayer electrical connecting as fabricated in claim 5 wherein the metal paste is diluted from 10 to 30% by weight with a solvent.

7. A monolithic multilayer ceramic substrate electrical interconnection system with interlayer electrical connecting by combinational blind hole vias and through holes and fabricated by:
   drilling a first set of green sheet laminae in accordance with a first predetermined hole pattern,
   stacking said first set of holed green sheet laminae with a binder rich side up,
   drilling a second set of green sheet laminae in accordance with a second predetermined hole pattern,
   stacking the second set of green said first and second predetermined hole patterns being such that some of the holes in said stacked second set of laminae will be in alignment with some of the holes in said stacked first set of laminae to provide combinational blind holes and through holes by laminar stacking with a metal paste composition including 70 to 90% molybdenum powder,
   rotating the wheel to remove excess metal paste and evenly coat the side walls of the blind and through-holes,
   removing the mask carrier from the uppermost green sheet lamina,
   metallizing the top and bottom surfaces of the green sheet laminar assembly with predetermined circuit patterns, and
   sintering the laminar assembly.

8. A monolithic multilayer ceramic substrate electrical interconnection system with interlayer electrical connecting as fabricated in claim 7, wherein the molybdenum powder includes an average powder size ranging from 1 to 5 microns.

9. A monolithic multilayer ceramic substrate electrical interconnection system with interlayer electrical connecting as fabricated in claim 8 wherein the metal paste is diluted from 10 to 30% by weight with a solvent.

* * * * *

UNITED STATES PATENT OFFICE
CERTIFICATE OF CORRECTION

PATENT NO. : 3,999,004
DATED : December 21, 1976
INVENTOR(S) : Octavio I. Chirino; Joseph Hromek, Kailash C. Joshi, and George C. Phillips, Jr.

It is certified that error appears in the above-identified patent and that said Letters Patent are hereby corrected as shown below:

Column 6, line 51    after "green" add

---sheet laminae upon said first set--- line 56    after second "holes" add

---stacking the uppermost green sheet lamina of said second set with a polyethylene-terphthalate carrier attached and adapted to function as a mask, attaching the laminar stack to a rotatable wheel, filling the blind hole and through-hole formation formed ---

Signed and Sealed this thirtieth Day of August 1977

[SEAL]

Attest:

RUTH C. MASON
Attesting Officer

C. MARSHALL DANN
Commissioner of Patents and Trademarks